(12) United States Patent
Classon et al.

(10) Patent No.: US 7,171,603 B2
(45) Date of Patent: Jan. 30, 2007

(54) METHOD AND APPARATUS FOR ENCODING AND DECODING DATA

(75) Inventors: Brian K. Classon, Palatine, IL (US); Yufei W. Blankenship, Streamwood, IL (US); Vipul A. Desai, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 427 days.

(21) Appl. No.: 10/839,995

(22) Filed: May 6, 2004

(65) Prior Publication Data

US 2005/0251730 A1 Nov. 10, 2005

(51) Int. Cl.
*H03M 13/13* (2006.01)
(52) U.S. Cl. .............. 714/752; 714/799; 714/800; 714/801
(58) Field of Classification Search ............. 714/752; *H03M 13/11, 13/13*
See application file for complete search history.

(56) References Cited

U.S. PATENT DOCUMENTS

2004/0098659 A1* 5/2004 Bjerke et al. ............. 714/776

* cited by examiner

*Primary Examiner*—R. Stephen Dildine

(57) ABSTRACT

A deterministic structure for controlled distribution of weight-2 columns is proposed for a parity-check matrix H that reduces the occurrence of undetected frame errors and significantly enhances the code performance in comparison to a randomly-constructed parity-check matrix. H comprises a non-deterministic section $H_1$ and a deterministic section $H_2$, and wherein $H_2$ comprises a first part comprising a column h having an odd weight greater than 2, and a second part comprising matrix elements for row i, column j equal to
  1 for i=j,
  1 for i=j+1,
  0 elsewhere.

19 Claims, 4 Drawing Sheets

100

200

METHOD AND APPARATUS FOR ENCODING AND DECODING DATA

FIELD OF THE INVENTION

The present invention relates generally to encoding and decoding data and in particular, to a method and apparatus for encoding and decoding data utilizing low-density parity-check (LDPC) codes.

BACKGROUND OF THE INVENTION

An LDPC code is a linear block code specified by a parity-check matrix H. In general, an LDPC code is defined over a Galois Field GF(q), $q \geq 2$. If q=2, the code is a binary code. As with all linear block codes, a k-bit information block $s_{1 \times k}$ is generally encoded by the code generator matrix $G_{k \times n}$ to become an n-bit codeword $x_{1 \times n}$, and the code rate is r=k/n. The codeword x is transmitted through a noisy channel, and the received signal vector y is passed to the decoder to estimate the information block $s_{1 \times k}$.

Given an n-dimensional space, the rows of G span the k-dimensional codeword subspace C, and the rows of the parity-check matrix $H_{m \times n}$ span the m-dimensional dual space $C^{\perp}$, where m=n−k. Since x=sG and $GH^T=0$, it follows that $xH^T=0$ for all codewords in subspace C, where "T" denotes matrix transpose. In the discussion of LDPC codes, this is generally written as $$Hx^T = 0^T \quad , (1)$$

where 0 is a row vector of all zeros, and the codeword x=[s p]=[$s_0, s_1, \ldots, s_{k-1}, p_0, p_1, \ldots, p_{m-1}$], where $p_0, \ldots p_{m-1}$ are the parity-check bits; and $s_0, \ldots s_{k-1}$ are the systematic bits, equal to the information bits within the information block.

In order to use an LDPC code with good error-correcting performance, an appropriate low-density parity-check matrix H has to be defined. For most irregular LDPC codes, this requires making a large portion of the columns of H to be weight-2 (i.e., two ones and all zeros in a column) in order to keep the overall density low (i.e., the overall matrix should be sparse). This large number of weight-2 columns can allow high weights (e.g., 30) to be assigned to some columns while still maintaining a low average column weight in H. (Note that the row weights are usually limited in range and are relatively small.)

Designing a parity-check matrix with various row and column weights is complicated when error performance is considered. For example, a matrix can be constructed with a series of randomly generated columns while satisfying the row weight and column weight constraints, however, with a large percentage of weight-2 columns in the matrix, randomly-generated weight-2 columns can easily contain a bad structure which induces an undetectable error event and a low minimum distance. In general, an undetectable error event of $N_{ud}$ bits could happen if $N_{ud}$ columns of the parity-check matrix sum (modulo 2) to the all-zero column. The all-zero column summation occurs with higher frequency when the parity-check matrix has a small size and contains weight-2 columns. The undetectable error event is directly linked to the minimum distance of the code which is equal to min($N_{ud}$). As a result, a randomly-generated parity-check matrix can have a small minimum distance, which causes a high probability of undetectable errors and an error floor at high signal-to-noise ratios. Furthermore, since code bits (elements of x) associated with weight-2 columns are much more prone to errors than code bits associated with higher-weight columns, a large percentage of undetectable frame errors is expected to involve weight-2 columns. Although there are several prior-art code construction guidelines cited or implied in literature such as (a) avoiding cycles of length 4 and (b) avoiding overlap between weight-2 columns when possible, these guidelines may not be sufficient for good error performance codes. Therefore, there is a need for deterministic distribution of weight-2 columns in which the occurrence of undetected frame errors is reduced in order to significantly enhance code performance in comparison to a randomly-constructed parity-check matrix.

Notwithstanding the above problem, another issue of LDPC codes is the high encoding complexity of the straightforward method using the generator matrix G corresponding to the H matrix defining the code. For a systematic LDPC encoder, parity-check bit $p_i$, i=0, ..., m−1, is generally computed from the given information bits, $s_0, \ldots, s_{k-1}$, m=n−k. Letting the codeword be x=[s p]=[$s_0, s_1, \ldots, s_{k-1}, p_0, p_1, \ldots, p_{m-1}$], the parity-check bits satisfy the parity-check equations of (1). A conventional encoding method transforms the parity-check matrix H into a systematic form $H_{sys}=[I_{m \times m}, P^T]$ through Gaussian elimination and column reordering so that the corresponding code generator matrix is G=[$P_{k \times m}, I_{k \times k}$]. Therefore, the conventional encoder calculates the parity-check bits using [$p_0, \ldots, p_{m-1}$]=[$s_0, \ldots, s_{k-1}$]P.

This straightforward method can cause implementation problems especially when the codeword size n is large. First, although H has low density (i.e., with a few 1's in the matrix and the number of 1's per row not growing with n), P and hence G usually have high density (i.e., many 1's in the matrix and the number of 1's per row increasing as n increases). Implementing the conventional encoder can require a large amount of memory to store the positions of the 1's in P. Secondly, due to the high density of P, the number of binary additions (only counting the terms when the elements of P are '1') is on the order of $n^2$; implying that the encoding complexity grows quadratically with n. Therefore, there is a need for an efficient encoder for irregular LDPC codes that takes advantage of the structure of a good performing irregular LDPC code to minimize preprocessing and admit a simple encoding program.

DETAILED DESCRIPTION OF THE DRAWINGS

To address the above-mentioned needs, a method and apparatus for encoding and decoding data is provided herein. In particular, parity-check bits are provided that are generated via a parity-check matrix H that reduces the occurrence of undetected frame errors and significantly enhances the code performance in comparison to a randomly-constructed parity-check matrix. H comprises a non-deterministic section $H_1$ and a deterministic section $H_2$, and wherein $H_2$ comprises a first part comprising a column h having an odd weight greater than 2, and a second part comprising matrix elements for row i, column j equal to 1 for i=j, 1 for i=j+1, 0 elsewhere.

The present invention encompasses a method for operating a transmitter that generates parity-check bits ($p_0, \ldots, p_{m-1}$) based on a current symbol set s=($s_0, \ldots, s_{k-1}$). The method comprises the steps of receiving the current symbol set s=($s_0, \ldots, s_{k-1}$), and using a matrix H to determine the parity-check bits. H comprises a non-deterministic section $H_1$ and a deterministic section $H_2$, and wherein $H_2$ comprises a first part comprising a column h having an odd weight greater than 2, and a second part comprising matrix elements for row i, column j equal to 1 for i=j, 1 for i=j+1, 0 elsewhere.

The present invention additionally encompasses a method for operating a receiver that estimates a current symbol set s=($s_0, \ldots, s_{k-1}$). The method comprises the steps of receiving a received signal vector y=($y_0 \ldots y_{n-1}$) and using matrix H to estimate the current symbol set ($s_0, \ldots, s_{k-1}$).

The present invention additionally encompasses an apparatus comprising storage means for storing the matrix H and a microprocessor using a matrix H to determine parity-check bits.

The present invention additionally encompasses an apparatus comprising storage means for storing matrix H, a receiver for receiving a signal vector y=($y_0 \ldots y_{n-1}$), and a microprocessor using a matrix H to determine a current symbol set ($s_0, \ldots, s_{k-1}$).

Figure 1:
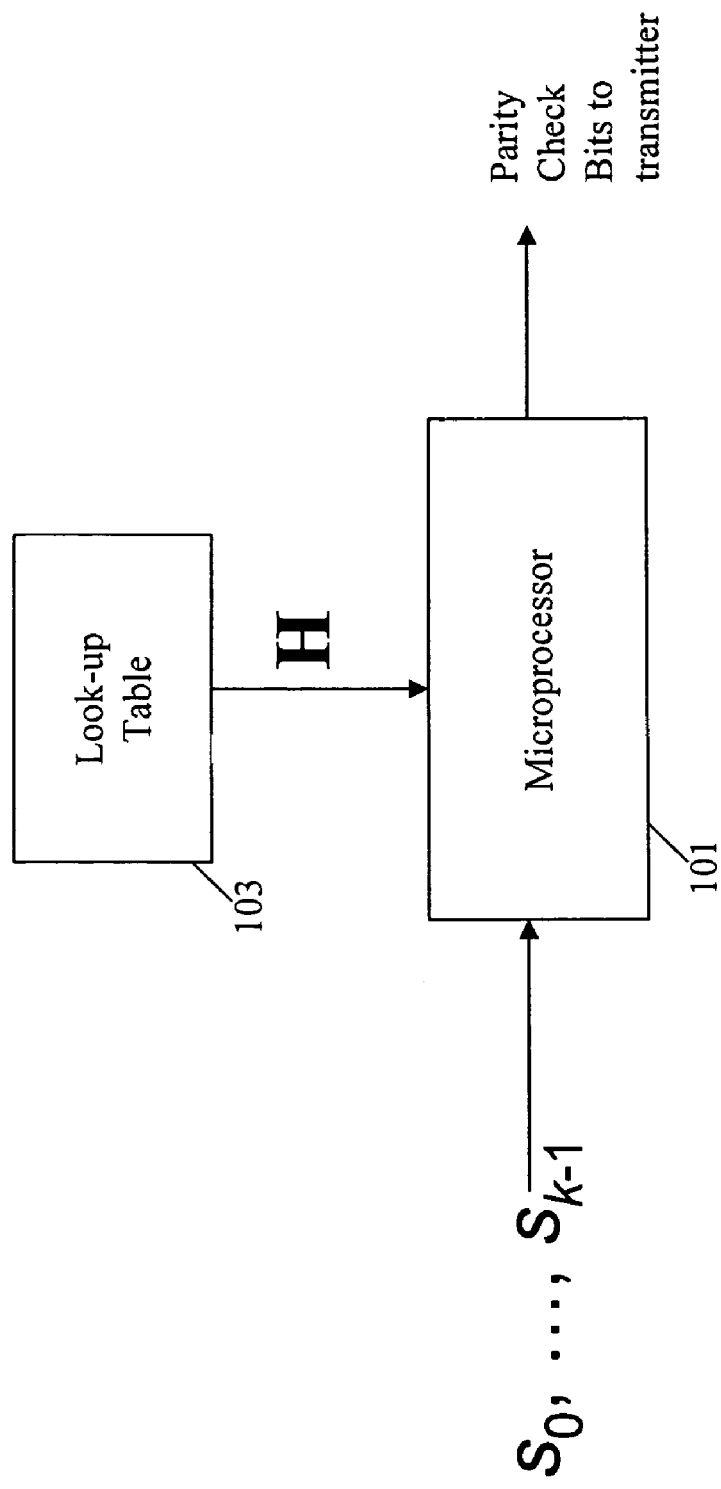
FIG. 1 is a block diagram of an encoder in accordance with the preferred embodiment of the present invention.

Turning now to the drawings, wherein like numerals designate like components, FIG. 1 is a block diagram of encoder 100 in accordance with a first embodiment of the present invention. As shown, encoder 100 comprises microprocessor 101 and lookup table 103. In the first embodiment of the present invention microprocessor 101 comprises a digital signal processor (DSP), such as, but not limited to MSC8100 and DSP56300 DSPs. Additionally, lookup table 103 serves as storage means to store a matrix, and comprises read-only memory, however, one of ordinary skill in the art will recognize that other forms of memory (e.g., random-access memory, magnetic storage memory, etc.) may be utilized as well. In a second embodiment, the functionality of the microprocessor 101 and the lookup table 103 can be incorporated into an application specific integrated circuit (ASIC) or field programmable gate array (FPGA). In particular, the lookup table 103 can be implemented in a form of memory corresponding to the existence or non-existence of signal paths in a circuit.

As discussed above, encoded data is generally output as a plurality of parity-check bits in addition to the systematic bits, where together the parity-check and systematic bits are a solution to $Hx^T=0^T$. In the first embodiment of the present invention a parity-check matrix H is stored in lookup table 103, and is accessed by microprocessor 101 to solve the above equation. In particular, microprocessor 101 determines appropriate values for the parity-check bits ($p_0, \ldots, p_{m-1}$) based on the current symbol set s=($s_0, \ldots, s_{k-1}$) and the parity-check matrix H. The parity-check bits and the symbol set is then passed to a transmitter transmitted to a receiver. H comprises a non-deterministic section $H_1$ (i.e., the value of each entry is not defined or determined to have a particular structure, and therefore can be random as long as certain design constraints are met) and a deterministic section $H_2$, (i.e., the value of each entry is defined or determined to have a particular structure).

The deterministic section $H_2$ is further composed of two parts. In particular, a first part comprises a first column h having an odd weight greater than 2, the second part $H'_2$ comprises matrix elements equal to a 1 for i=j and a 1 for i=j+1, and a 0 elsewhere, for row i, column j of $H'_2$, $0 \leq i \leq m-1$, $0 \leq j \leq m-2$. Thus, the overall parity-check matrix H can be represented by $$H=[H_1 H_2], \qquad (2)$$

and the deterministic section $H_2$ can be represented by $$H_2 = [h \ H'_2] \qquad (3)$$

$$= \begin{bmatrix} h_0 & : & 1 & & & & & & & \\ h_1 & : & 1 & 1 & & & & & & \\ \cdot & : & & 1 & 1 & & & 0 & & \\ \cdot & : & & & 1 & 1 & & & & \\ \cdot & : & & & & 1 & 1 & & & \\ \cdot & : & & & & & 1 & 1 & & \\ \cdot & : & & 0 & & & & 1 & 1 & \\ \cdot & : & & & & & & & 1 & 1 \\ \cdot & : & & & & & & & \ddots & \ddots \\ \cdot & : & & & & & & & & 1 & 1 \\ \cdot & : & & & & & & & & & 1 & 1 \\ h_{m-1} & : & & & & & & & & & & 1 \end{bmatrix}.$$

In the preferred embodiment of the present invention $H_1$ can be any binary matrix of size m-by-k. (In other words, $H_1$ can be regular or irregular or have any desired weight distribution.) While $H_2$ is not lower triangular, it does have a simple structure. The first column of $H_2$ (denoted h) has an odd number of 1's (3 or more ones), and the rest of the columns (denoted by the m-by-(m−1) matrix $H'_2$) are weight-2 with a maximum of 1 overlap between each other. (The prime in $H'_2$ indicates a sub-matrix, not a transpose.)

Although the deterministic sub-matrix $H_2$ always has (m−1) weight-2 columns, it is not expected to affect code performance, since there are no cycles between the weight-2 columns, and the optimal weight distributions reported in. the literature generally include a large percentage of weight-2 columns. It is expected that the $H_1$ sub-matrix and the h column will be designed such that the entire matrix H has good error-correcting performance. For example, $H_1$ is typically composed of columns with weight higher than 2.

Unlike the prior art, the $H_2$ matrix is chosen to avoid any weight-1 column. A weight-1 column can degrade performance since a bit corresponding to a weight-1 column does not update the soft information during iterative decoding. The deterministic sub-matrix $H_2$ is designed to correspond to the parity-check bits instead of the systematic bits, so that the systematic bits are better protected due to the higher column weights in $H_1$.

Encoding Method

The $H_2$ structure exemplified above makes the encoding complexity linear, instead of quadratic, in code size. Encoding can be achieved without finding or computing a generator matrix.

Given any block of information bits s, the m parity-check bits can be found by solving the equations defined by $$[ (H_1)_{m \times k} \quad h_{m \times 1} \quad (H'_2)_{m \times (m-1)} ] \begin{bmatrix} s^T \\ p^T \end{bmatrix} = 0. \quad (4)$$

Due to the odd column weight of h and the m−1 weight-2 columns of $H'_2$, the summation of all the equation in (4) yields $$p_0 = \left( \sum_{row} H_1 \right) s^T, \quad (5)$$

where $$\sum_{row} H_1$$

denotes the row vector after summing up all rows of $H_1$. Note that the summation can equivalently be performed on the intermediate column vector $v=[v_0, v_1, \ldots, v_{m-1}]^T = H_1 s^T$, but performing the summation on the rows of $H_1$ can be done beforehand and results in fewer operations to compute $p_0$.

With $p_0$ determined, the rest of parity-check bits, $p_1$ through $p_{m-1}$ can be found recursively. For example, $$p_1 = h_0 p_0 + v_0,$$
$$p_2 = h_1 p_0 + p_1 + v_1,$$
$$p_3 = h_2 p_0 + p_2 + v_2,$$
$$p_{m-1} = h_{m-2} p_0 + p_{m-2} + v_{m-2}, \quad (6)$$

where $[h_0, h_1, \ldots, h_{m-2}, h_{m-1}]^T$ is the column h in (3). Since all the variables are binary in (6), the encoding complexity is very low. Further, to simplify implementation, a vector $w=[w_0, w_1, \ldots, w_{m-2}, w_{-1}] = [h_0 \, p_0 + v_0, h_1 \, p_0 + v_1, \ldots, h_{m-2} \, p_0 + v_{m-2}, h_{m-1} \, p_0 + v_{m-1}]$ can be stored so that the parity-check bits are found by $p_1 = w_0$, $p_i = p_{i-1} + w_{i-1}$, $i=2, 3, \ldots m-1$.

The parity-check equations can also be recursively solved from $p_{m-1}$ through $p_1$. In this case, the parity-check bits are found by $p_{m-1} = w_{m-1}$, $p_i = p_{i+1} + w_i$, $i=m-2, \ldots, 2, 1$.

Additional structure in h can be used to further reduce encoding complexity. For example, in (3) most entries of h may be the trailing zeros (e.g., $h=[1\,0\,0\,1\,0\,0\,1\,0 \ldots 0]^T$). Knowing that all values of $h_i$ are 0 for $z \leq i \leq m-1$ can simplify the step of determining the parity-check bits recursively, as in (6), allowing variations of the recursive encoding structure. In one example, $w_i = v_i$ for $z \leq i \leq m-1$, thus $p_i$, $z \leq i \leq m-1$, can be found before finding $p_0$. Then $p_0$ through $p_{z-1}$ can be found based on s and $p_z$.

Decoding Method

Figure 2:
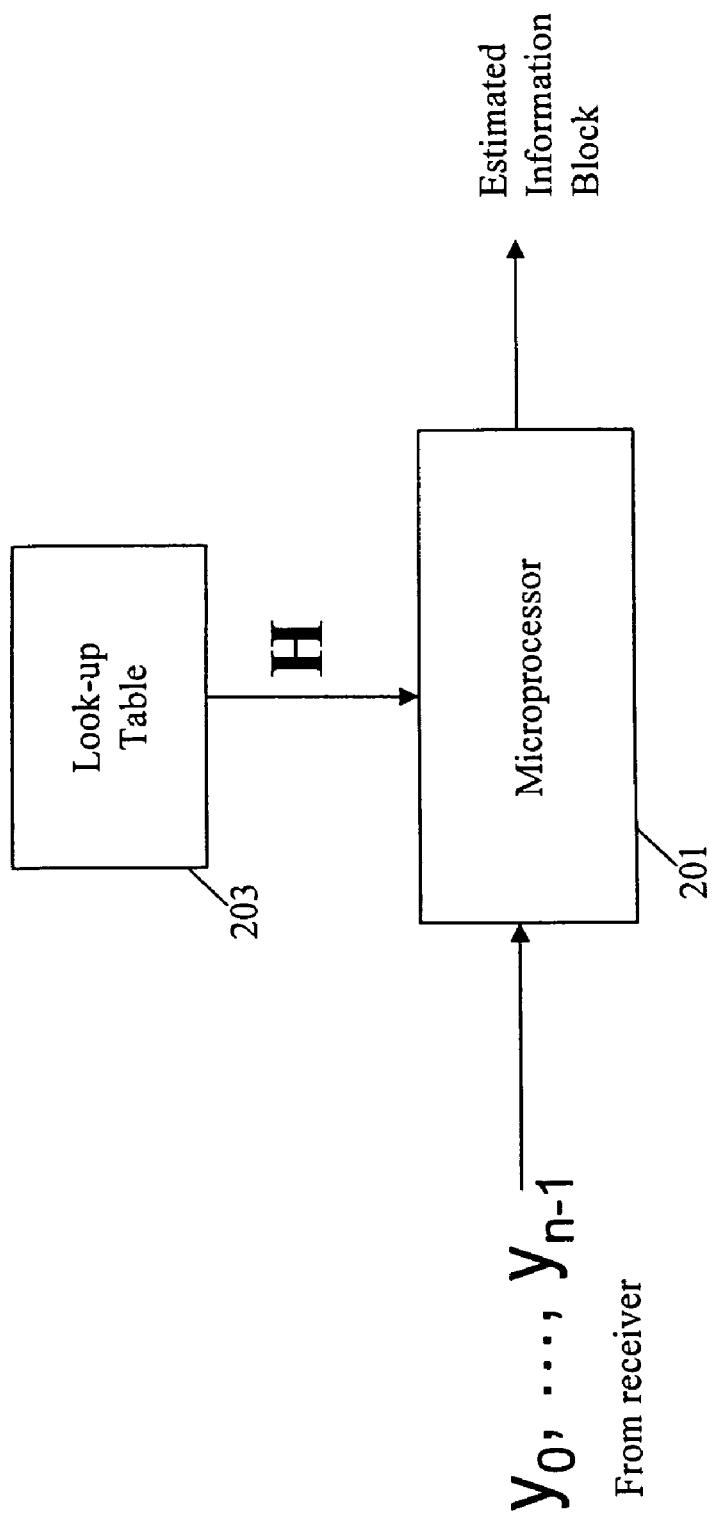
FIG. 2 is a block diagram of a decoder in accordance with the preferred embodiment of the present invention.

FIG. 2 is a block diagram of decoder 200 in accordance with one embodiment of the present invention. As shown, decoder 200 comprises microprocessor 201 and lookup table 203. In a first embodiment of the present invention microprocessor 201 comprises a digital signal processor (DSP), such as, but not limited to MSC8100 and DSP56300 DSPs. Additionally, lookup table 203 acts as storage means for storing matrix H, and comprises read-only memory: However, one of ordinary skill in the art will recognize that other forms of memory (e.g., random-access memory, magnetic storage memory, etc.) may be utilized as well. In a second embodiment, the functionality of the microprocessor 201 and the lookup table 203 can be incorporated into an application specific integrated circuit (ASIC) or field programmable gate array (FPGA). In particular, the lookup table 203 can be implemented in a form of memory corresponding to the existence or non-existence of signal paths in a circuit.

The received signal vector (received via a receiver) $y=(y_0 \ldots y_{n-1})$ corresponds to the codeword x transmitted through a noisy channel, where the encoded data x, as discussed above, is a solution to $Hx^T = 0^T$. In the first embodiment of the present invention a parity-check matrix H is stored in lookup table 203, and is accessed by microprocessor 201 to decode y and estimate the information block s (i.e., the current symbol set $(s_0, \ldots, s_{k-1})$). In particular, microprocessor 201 estimates the current symbol set $(s_0, \ldots, s_{k-1})$ based on the received signal vector $y=(y_0 \ldots y_{n-1})$ and the parity-check matrix H. As discussed above, H comprises a non-deterministic section $H_1$ (i.e., the value of each entry is not defined or determined to have a particular structure, and therefore can be random as long as certain design constraints are met) and a deterministic section $H_2$, (i.e., the value of each entry is defined or determined to have a particular structure).

As is well known in the art, there are many ways the decoder 200 can use the parity-check matrix H in the microprocessor 201 for decoding. One such way is to perform a vector-matrix multiplication with H to determine a likely error pattern. Another such way is to use H to construct a bipartite graph where the edges in the graph correspond to the 1's in H, and to iteratively process y on the bipartite graph.

Code Modification

It is often desirable to create a new code (a new or different parity-check matrix) by modifying an existing code (an existing parity-check matrix). The new code typically has a different number of information or parity-check bits than the existing code. If the modifications are appropriate, the new code can be encoded and decoded via a similar procedure as the original code. Modifications of adding or removing parity-check bits are especially difficult for LDPC codes because the resulting code may not have good properties for encoding or decoding even if the original code had good properties. The following sub-sections describe two ways of modifying the codes that maintain the good properties of the code.

Simple Modification

With the $H_2$ structure described above, the H matrix can be expanded or shrunk by an arbitrary number of parity-check bits without changing the structure of $H_2$. Each expanded or shrunk code uses the same encoding procedure illustrated above, and maintains good performance when its $H_1$ sub-matrix is constructed carefully.

For example, if g parity-check bits are to be punctured to achieve a higher-rate (n−g, k) code, the H matrix is modified by removing g right-most columns and g lowest rows. Alternatively, the H matrix can be extended by g parity-check bits to achieve a lower-rate (n+g, k) code by adding g columns on the right and g rows on the bottom, maintaining the diagonal weight-2 column structure in $H_2$.

To avoid having a undesirable first column (e.g., weight lower than 3, or even weight) in $H_2$ when puncturing, the structure, where the 1's of h are distributed towards the top, is preferred. For example, in (3) with $h=[1\ 0\ 0\ 1\ 0\ 0\ 1\ 0\ \ldots\ 0]^T$, only 3 entries of h are 1 and are located towards the top of h.

While simple modification retains the ease of encoding of the original code, and promotes a reduction in memory for storing matrices, codes created by simple modification are not related in the sense that the parity-check bits of the higher rate code are a subset of the lower rate code's parity-check bits. The relationship where the parity-check bits of the higher rate code are a subset of the lower rate code's parity-check bits given the same information symbol set is called rate compatibility.

Rate-Compatible Code Modification

The H matrix defined above can be modified to create rate-compatible LDPC codes by concatenating portions similar to $H_2$. For example, consider three codes, where the superscript indicates code 1, code 2, and code 3, respectively. The parity-check bits of code 1 are a subset of the parity-check bits of code 2 (i.e., the parity-check bits of code 1 are nested within the parity-check bits of code 2), and the parity-check bits of code 2 are a subset of the parity-check bits of code 3 (i.e., the parity-check bits of code 2 are nested within the parity-check bits of code 3, and in turn the parity bits of code 1 are nested within the parity bits of code 3). Code 1 has a parity-check matrix $H^{(1)}$ defined by $$H^{(1)} = [H_1^{(1)} H_2^{(1)}], \qquad (7)$$

where $H_1^{(1)}$ is an $m_1$-by-k matrix and $H_2^{(1)}$ is an $m_1$-by-$m_1$ matrix whose structure can follow (3), and produces parity-check bits $p_0, p_1, \ldots, p_{m_1-1}$. Note that (7) is equivalent to (2), and the superscripts "(1)" are just used to emphasize the first code (i.e., $H^{(1)}=H$, $m_1=m$).

Code 2 has a parity-check matrix $H^{(2)}$ defined by $$H^{(2)} = \begin{bmatrix} H_1^{(1)} & H_2^{(1)} & 0 \\ \hline H_1^{(2)} & & H_2^{(2)} \end{bmatrix}, \qquad (8)$$

where $H_1^{(2)}$ is an $(m_2-m_1)$-by-$(k+m_1)$ matrix, $H_2^{(2)}$ is an $(m_2-m_1)$-by-$(m_2-m_1)$ matrix whose structure can follow that set forth in equation (3), and code 2 produces parity-check bits $p_0, p_1, \ldots, p_{m_2-1}$. As it follows the structure set forth in (3), the deterministic section $H_2^{(2)}$ has a first column $h^{(2)}$ having an odd weight greater than 2, and a second part comprising a 1 for $i=j$ and a 1 for $i=j+1$, and 0 elsewhere, for row i, column j, $0 \leq i \leq m-1$, $0 \leq j \leq m-2$. The first column $h^{(2)}$ does not have to have the same size or composition as $h^{(1)}$, which is the column h from code 1. Due to the nesting structure, parity-check bits $p_{m_1}, \ldots, p_{m_2-1}$ can be obtained from $H_1^{(2)}, H_2^{(2)}$, the systematic bits s, and the previously computed parity-check bits $p_0, p_1, \ldots, p_{m_1-1}$ using the encoding techniques of equations (5) and (6).

Code 3 has a parity-check matrix $H^{(3)}$ defined by $$H^{(3)} = \begin{bmatrix} H_1^{(1)} & H_2^{(1)} & 0 & 0 \\ H_1^{(2)} & & H_2^{(2)} & \\ \hline H_1^{(3)} & & & H_2^{(3)} \end{bmatrix}, \qquad (9)$$

where $H_1^{(3)}$ is an $(m_3-m_2)$-by-$(k+m_2)$ matrix, $H_2^{(3)}$ is an $(m_3-m_2)$-by-$(m_3-m_2)$ matrix whose structure can follow equation (3), and Code 3 produces parity-check bits $p_0, p_1, \ldots, p_{m_3-1}$. Due to the nesting structure, parity-check bits $p_{m_2}, \ldots, p_{m_3-1}$ can be obtained from $H_1^{(3)}, H_2^{(3)}$, the systematic bits s, and the previously computed parity-check bits $p_0, p_1, \ldots, p_{m_2-1}$ using the encoding techniques of equations (5) and (6). It should be noted that, like H, both $H^{(2)}$ and $H^{(3)}$ comprise a deterministic section having a first column having an odd weight greater than 2, and having all remaining columns comprise a 1 for $i=j$ and a 1 for $i=j+1$, and 0 elsewhere, for row i, column j, $0 \leq i \leq m-1$, $0 \leq j \leq m-2$, as illustrated in (3).

The "mother code" defined in equation (9) effectively defines codes of three different rates: $k/(k+m_1)$, $k/(k+m_2)$, and $k/(k+m_3)$. The three pieces ($[s, p_0, p_1, \ldots p_{m_1-1}]$, $[s, p_0, p_1, \ldots, p_{m_2-1}]$, and $[s, p_0, p_1, \ldots, p_{m_3-1}]$) are then used for different transmission/reception code rates, and because they are rate-compatible, can be used for incremental redundancy (IR). In IR, a first transmission may send $[s, p_0, p_1, \ldots, p_{m_1-1}]$, a second transmission may send $[p_{m_1}, \ldots, p_{m_2-1}]$, and a third transmission may send $[p_{m_2}, \ldots, p_{m_3-1}]$. Transmissions beyond the first may be sent if earlier transmissions failed (was not received or was decoded incorrectly), or if the protocol specifies multiple transmissions. Although the discussion above assumes transmitting additional parity bits of code 2, code 3, . . . , etc., it is understood by those skilled in the art that other modes of transmission are possible. For example, when the first transmission fails, the second transmission may send additional parity bits of both code 2 and code 3, $[p_{m_1}, \ldots, p_{m_3-1}]$.

In the following, an example presented to show how the new parity-check bits for code 2 can be generated from the information and parity-check bits of code 1. To illustrate this property, define k=9, $m_1$=9, $m_2$=13, the $m_1$-by-(k+$m_1$) matrix $$H^{(1)} = \begin{bmatrix} 1 & 0 & 0 & 0 & 1 & 0 & 0 & 0 & 1 & 1 & 0 & 0 & 0 & 0 & 0 & 0 \\ 0 & 1 & 0 & 0 & 0 & 1 & 0 & 0 & 0 & 1 & 1 & 0 & 0 & 0 & 0 & 0 \\ 0 & 0 & 1 & 0 & 0 & 0 & 1 & 0 & 0 & 0 & 1 & 1 & 0 & 0 & 0 & 0 \\ 0 & 0 & 0 & 1 & 0 & 0 & 0 & 1 & 1 & 0 & 0 & 1 & 1 & 0 & 0 & 0 \\ 0 & 0 & 0 & 0 & 1 & 0 & 0 & 0 & 0 & 0 & 0 & 0 & 1 & 1 & 0 & 0 & 0 \\ 1 & 0 & 0 & 0 & 1 & 0 & 0 & 0 & 0 & 0 & 0 & 0 & 0 & 1 & 1 & 0 & 0 \\ 0 & 1 & 0 & 0 & 0 & 1 & 0 & 0 & 0 & 1 & 0 & 0 & 0 & 0 & 1 & 1 & 0 \\ 0 & 0 & 1 & 0 & 0 & 0 & 1 & 0 & 0 & 0 & 0 & 0 & 0 & 0 & 0 & 1 & 1 \\ 0 & 0 & 0 & 1 & 1 & 0 & 1 & 1 & 1 & 0 & 0 & 0 & 0 & 0 & 0 & 0 & 1 \end{bmatrix}$$

$$= [H_1^{(1)} \quad H_2^{(1)}]$$

and the $m_2$-by-$(k+m_2)$ matrix $$H^{(2)} = \begin{bmatrix} & & & & & & & & & & & & & & & & & 0 & 0 & 0 & 0 \\ & & & & & & & & & & & & & & & & & 0 & 0 & 0 & 0 \\ & & & & & & & & & & & & & & & & & 0 & 0 & 0 & 0 \\ & & & & & & & & & & & & & & & & & 0 & 0 & 0 & 0 \\ & & & & & & H^{(1)} & & & & & & & & & & & 0 & 0 & 0 & 0 \\ & & & & & & & & & & & & & & & & & 0 & 0 & 0 & 0 \\ & & & & & & & & & & & & & & & & & 0 & 0 & 0 & 0 \\ & & & & & & & & & & & & & & & & & 0 & 0 & 0 & 0 \\ & & & & & & & & & & & & & & & & & 0 & 0 & 0 & 0 \\ 0 & 0 & 0 & 0 & 1 & 0 & 0 & 0 & 1 & 0 & 0 & 0 & 0 & 1 & 0 & 1 & 1 & 1 & 1 & 0 & 0 \\ 0 & 0 & 0 & 0 & 0 & 1 & 0 & 0 & 0 & 0 & 1 & 0 & 0 & 0 & 0 & 1 & 0 & 0 & 1 & 1 & 0 \\ 0 & 0 & 0 & 0 & 0 & 0 & 1 & 0 & 0 & 0 & 1 & 0 & 1 & 0 & 0 & 1 & 0 & 0 & 1 & 0 & 1 & 1 \\ 0 & 0 & 0 & 0 & 0 & 0 & 0 & 1 & 0 & 1 & 0 & 0 & 0 & 1 & 1 & 1 & 0 & 0 & 1 & 0 & 0 & 1 \end{bmatrix}$$

$$= \begin{bmatrix} H_1^{(1)} & H_2^{(1)} & 0 \\ H_1^{(2)} & H_2^{(2)} \end{bmatrix}$$

Assume that the parity-check bits $p_0$ through $p_{m_1-1}$ ($=p_8$), are already computed. Computing $p_{m_1}, \ldots, p_{m_2-1}$ can use the encoding techniques of equations (5) and (6) as follows:

Compute $$\sum_{row} H_1^{(2)} = [0\ 0\ 0\ 0\ 1\ 1\ 1\ 1\ 1\ 1\ 1\ 1\ 1\ 0\ 0\ 0\ 1].$$

Then $p_{m_1} = p_9 = \sum_{row}[H_1^{(2)}]\begin{bmatrix} s^T \\ p_0 \\ \vdots \\ p_{m_1-1} \end{bmatrix} =$ $s_4 + s_5 + s_6 + s_7 + s_8 + p_0 + p_1 + p_2 + p_3 + p_4 + p_8,$ $$p_{10} = row_0(H_1^{(2)})\begin{bmatrix} s^T \\ p_0 \\ \vdots \\ p_{m_1-1} \end{bmatrix} + p_9 = s_4 + s_8 + p_5 + p_7 + p_8 + p_9,$$

$$p_{11} = row_1(H_1^{(2)})\begin{bmatrix} s^T \\ p_0 \\ \vdots \\ p_{m_1-1} \end{bmatrix} + p_{10} = s_5 + p_2 + p_7 + p_{10},$$

$$p_{12} = row_2(H_1^{(2)})\begin{bmatrix} s^T \\ p_0 \\ \vdots \\ p_{m_1-1} \end{bmatrix} + p_{11} + p_9 = s_6 + p_1 + p_3 + p_6 + p_{11} + p_9,$$

where the function $row_i(H)$ selects the i-th row of matrix H. Although the preferred method is presented above for finding $p_{m_1}$, other similar methods are possible. For example, it can also be found by $$p_{m_1} = \left( \sum_{row} \begin{bmatrix} H_1^{(1)} & H_2^{(1)} \\ H_1^{(2)} \end{bmatrix} \right) \begin{bmatrix} s^T \\ p_0 \\ \vdots \\ p_{m_1-1} \end{bmatrix}.$$

As shown above, once the first parity-check bits for matrix H of the first code are transmitted, and if it has been determined that the first transmission has failed, additional parity-check bits ($p_m, \ldots, p_{m_2-1}$) can be computed and transmitted based on a current symbol set $s=(s_0, \ldots, s_{k-1})$ and the first parity-check bits ($p_0, \ldots, p_{m-1}$). Matrix $H^{(2)}$ is used to determine the additional parity-check bits wherein $H^{(2)}$ is based on H as shown in equation (8). This process may continue indefinitely. Thus during operation, microprocessor 101 exploits the structure of H to compute the m parity-check bits based on equations (5) and (6). As additional parity-check bits are needed, they are computed using matrices defined above with reference to equations (8) and (9). Again, recall that $H^{(1)}=H$ and $m_1=m$.

Figure 3:
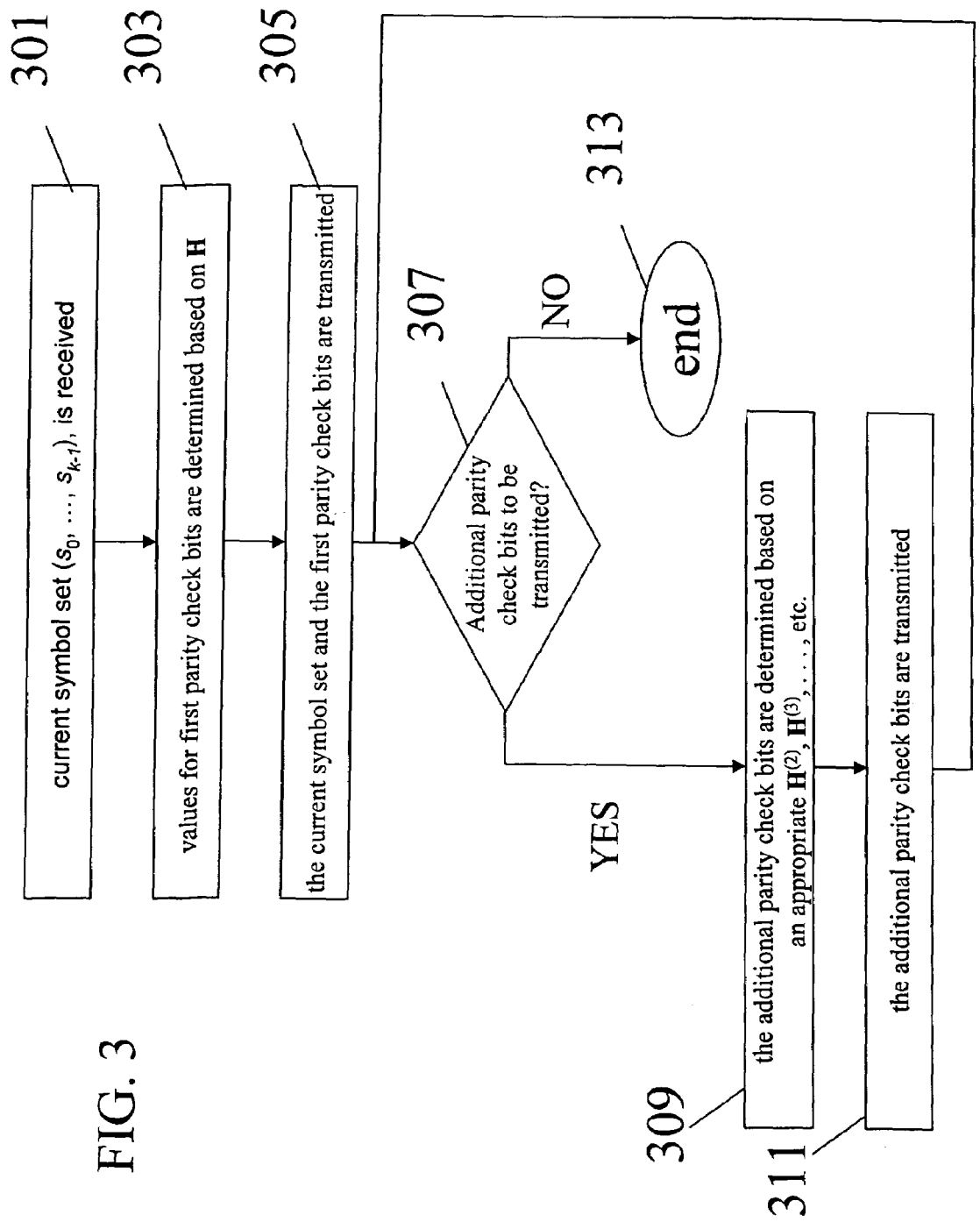
FIG. 3 is a flow chart showing the operation of the encoder of FIG. 1 in accordance with the preferred embodiment of the present invention.

FIG. 3 is a flow chart showing the operation of encoder 100, and in particular, microprocessor 101. The logic flow begins at step 301 where a current symbol set ($s_0, \ldots, s_{k-1}$) is received. At step 303, values for first parity-check bits are determined based on H. In particular, the first parity-check bits ($p_0, \ldots, p_{m-1}$) are determined as described above in equations (5) and (6). At step 305 the current symbol set and the first parity-check bits are transmitted. At step 307 a determination is made as to whether any additional parity-check bits need to be transmitted. This determination may be made, for example, if the first transmission failed (was not received or was decoded incorrectly), or if the transmission protocol always specifies a second transmission. If, at step 307 it is determined that additional parity-check bits need to be transmitted, then the logic flow continues to step 309 where the additional parity-check bits are determined based on an appropriate $H^{(2)}, H^{(3)}, \ldots$, etc. The choice of sending parity-check bits of $H^{(2)}, H^{(3)}, \ldots$, etc may be based on, for example, transmission protocol, quality metrics, etc. At step

311, the additional parity-check bits are transmitted and the logic flow returns to step 307. If, at step 307 it is determined that no additional parity-check bits need to be transmitted, then the logic flow ends at step 313.

Figure 4:
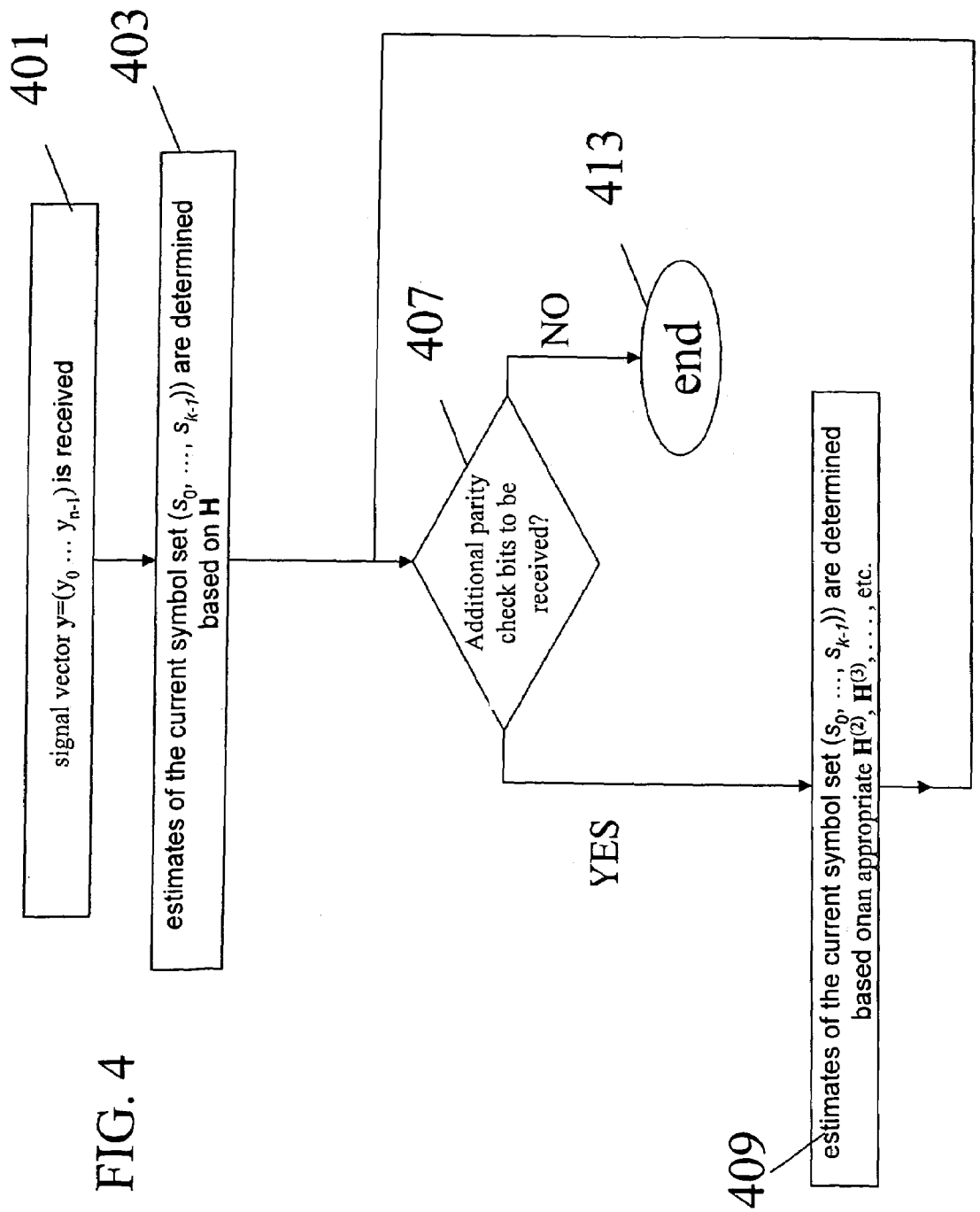
FIG. 4 is a flow chart showing operation of the decoder of FIG. 2 in accordance with the preferred embodiment of the present invention.

FIG. 4 is a flow chart showing the operation of decoder 200, and in particular, microprocessor 201. The logic flow begins at step 401 where the received signal vector $y=(y_0, \ldots, y_{n-1})$ is received. At step 403, estimates of the information block s (i.e., the current symbol set $(s_0, \ldots, s_{k-1})$) are determined based on H. As is well known in the art, there are many ways the decoder 200 can use the parity-check matrix H in the microprocessor 201 for decoding. One such way is to perform a vector-matrix multiplication with H to determine a likely error pattern. Another such way is to use H to construct a graph where the edges in the graph correspond to the 1's of H, and to iteratively process y on the graph. At step 407 a determination is made as to whether additional parity-check bits will be received, with the additional parity-check bits received in the form of an additional received signal vector of the additional parity-check bits passed through a noisy channel. This determination may be made, for example, if the first transmission failed (was not received or decoded correctly), or if the transmission protocol always specifies an additional transmission. If, at step 407 it is determined that additional parity-check bits will be received, then the logic flow continues to step 409 where the estimates of the information block s (i.e., the current symbol set $(s_0, \ldots, s_{k-1})$) are determined based on an appropriate $H^{(2)}$, $H^{(3)}$, ..., etc. and the received additional parity check bits. Logic flow then returns to step 407. If, at step 407 it is determined that no additional parity-check bits will be received, then the logic flow ends at step 413.

While the invention has been particularly shown and described with reference to a particular embodiment, it will be understood by those skilled in the art that various changes in form and details may be made therein without departing from the spirit and scope of the invention. For example, while the invention has been shown with the ordering of $s_i$ and $p_i$ within x defined, one of ordinary skill in the art will recognize that other ordering of the bits within x can occur since the codeword bits can be collected in any order as long as the columns of H are reordered accordingly. Additionally, while the above-description has been particularly shown and described with reference to binary codes (i.e., codes defined over the Galois Field GF(2)), one of ordinary skill in the art will recognize that an arbitrary GF may be utilized as well. Although the examples given above are shown in one format, other formats are possible which allow similar encoding and code modification procedure. For example, the column h may be located in any column of $H_2$, not just the first column. In another example, the bits of x may be permuted, requiring permutation of the columns of H. In yet another example, the rows of H may be permuted, without affecting the value of the parity-check bits. The matrix H may also be used in any type of decoder that relies upon a parity-check matrix. It is intended that such changes come within the scope of the following claims.

The invention claimed is:

1. A method for operating a transmitter that generates parity-check bits $(p_0, \ldots, p_{m-1})$ based on a current symbol set $s=(s_0, \ldots, s_{k-1})$, the method comprising the steps of:
   receiving the current symbol set $s=(s_0, \ldots, s_{k-1})$;
   using a matrix H to determine the parity-check bits, wherein H comprises a non-deterministic section $H_1$ and a deterministic section $H_2$, and wherein $H_2$ comprises a first part comprising a column h having an odd weight greater than 2, and a second part comprising matrix elements for row i, column j equal to 1 for i=j,
   1 for i=j+1,
   0 elsewhere; and transmitting the parity-check bits along with the current symbol set.

2. The method of claim 1 wherein:

$$H_2 = [h \; H_2'] = \begin{bmatrix} h_0 & 1 & & & & & & & & \\ h_1 & 1 & 1 & & & & & & & \\ \vdots & & 1 & 1 & & & 0 & & & \\ \vdots & & & 1 & 1 & & & & & \\ \vdots & & & & 1 & 1 & & & & \\ \vdots & & & & & 1 & 1 & & & \\ \vdots & & & 0 & & & 1 & 1 & & \\ \vdots & & & & & & & 1 & 1 & \\ \vdots & & & & & & & & \ddots & \ddots \\ \vdots & & & & & & & & 1 & 1 \\ \vdots & & & & & & & & & 1 & 1 \\ h_{m-1} & & & & & & & & & & 1 \end{bmatrix}$$

3. The method of claim 1 wherein the step of using matrix H to determine the parity-check bits $(p_0, p_1, \ldots, p_{m-1})$ comprises the step of determining $$p_0 = \left(\sum_{row} H_1\right) s^T,$$

where $$\sum_{row} H_1$$

denotes the row vector after summing up all rows of $H_1$.

4. The method of claim 1 wherein the step of using matrix H to determine the parity-check bits $(p_0, p_1, \ldots, p_{m-1})$ comprises the step of determining $$p_0 = \left(\sum_{row} H_1\right) s^T,$$

where $$\sum_{row} H_1$$

denotes the row vector after summing up all rows of $H_1$ and determining $p_1, \ldots, p_{m-1}$ recursively via $p_1 = h_0 p_0 + v_0$, $p_2 = h_1 p_0 + p_1 + v_1$, $p_3 = h_2 p_0 + p_2 + v_2$,

...

$p_{m-1} = h_{m-2} p_0 + p_{m-2} + v_{m-2}$ where $v = [v_0, v_1, \ldots, v_{m-1}]^T = H_1 s^T$.

5. The method of claim 1 wherein the step of using matrix H to determine the parity-check bits $(p_0, p_1, \ldots, p_{m-1})$ comprises the step of determining $$p_0 = \left(\sum_{row} H_1\right) s^T,$$

where $$\sum_{row} H_1$$

denotes a row vector after summing up all rows of $H_1$ and determining $p_1, \ldots, p_{m-1}$ recursively.

6. The method of claim 1 further comprising the step of:
determining additional parity-check bits need to be transmitted; and
transmitting the additional parity-check bits $(p_m, \ldots, p_{m_2-1})$ based on the current symbol set $s = (s_0, \ldots, s_{k-1})$ and $(p_0, \ldots, p_{m-1})$.

7. The method of claim 6 further comprising the step of using a matrix $H^{(2)}$ to determine the additional parity-check bits wherein $H^{(2)}$ is based on H.

8. The method of claim 7 wherein $H^{(2)}$ comprises a deterministic section $H_2^{(2)}$, wherein $H_2^{(2)}$ comprises a first column $h^{(2)}$ having an odd weight greater than 2, and a second part comprising matrix elements for row i, column j equal to
1 for i=j,
1 for i=j+1,
0 elsewhere.

9. A method for operating a receiver that estimates a current symbol set $s = (s_0, \ldots, s_{k-1})$, the method comprising the steps of:
receiving a received signal vector $y = (y_0 \ldots y_{n-1})$; and
using a matrix H to estimate the current symbol set $(s_0, \ldots, s_{k-1})$, wherein H comprises a non-deterministic section $H_1$ and a deterministic section $H_2$, and wherein $H_2$ comprises a first part comprising a column h having an odd weight greater than 2, and a second part comprising matrix elements for row i, column j equal to
1 for i=j,
1 for i=j+1,
0 elsewhere.

10. The method of claim 9 wherein:

$H_2 = [h \ H_2']$

-continued $$= \begin{bmatrix} h_0 & 1 & & & & & & & \\ h_1 & 1 & 1 & & & & & & \\ \vdots & & 1 & 1 & & & 0 & & \\ \vdots & & & 1 & 1 & & & & \\ \vdots & & & & 1 & 1 & & & \\ \vdots & & & & & 1 & 1 & & \\ \vdots & & & 0 & & & 1 & 1 & \\ \vdots & & & & & & & 1 & 1 \\ \vdots & & & & & & & & \ddots & \ddots \\ \vdots & & & & & & & & & 1 & 1 \\ \vdots & & & & & & & & & & 1 & 1 \\ h_{m-1} & & & & & & & & & & & 1 \end{bmatrix}.$$

11. The method of claim 9 further comprising the step of:
determining that additional parity-check bits will be received; and
using the received additional parity-check bits to estimate the current symbol set $(s_0, \ldots, s_{k-1})$.

12. The method of claim 9 further comprising the step of: using a matrix $H^{(2)}$ to determine the current symbol set $(s_0, \ldots, s_{k-1})$, wherein $H^{(2)}$ is based on H.

13. The method of claim 12 wherein $H^{(2)}$ comprises a deterministic section $H_2^{(2)}$, wherein $H_2^{(2)}$ comprises a first column $h^{(2)}$ having an odd weight greater than 2, and a second part comprising matrix elements for row i, column j equal to
1 for i=j,
1 for i=j+1,
0 elsewhere.

14. An apparatus comprising:
storage means for storing a matrix H;
a microprocessor using a matrix H to determine parity-check bits, wherein H comprises a non-deterministic section $H_1$ and a deterministic section $H_2$, and wherein $H_2$ comprises a first part comprising a column h having an odd weight greater than 2, and a second part comprising matrix elements for row i, column j equal to
1 for i=j,
1 for i=j+1,
0 elsewhere; and
a transmitter for transmitting the parity-check bits.

15. The apparatus of claim 14 wherein $H_2 = [h \ H_2']$ $$= \begin{bmatrix} h_0 & 1 & & & & & & & \\ h_1 & 1 & 1 & & & & & & \\ \vdots & & 1 & 1 & & & 0 & & \\ \vdots & & & 1 & 1 & & & & \\ \vdots & & & & 1 & 1 & & & \\ \vdots & & & & & 1 & 1 & & \\ \vdots & & & 0 & & & 1 & 1 & \\ \vdots & & & & & & & 1 & 1 \\ \vdots & & & & & & & & \ddots & \ddots \\ \vdots & & & & & & & & & 1 & 1 \\ \vdots & & & & & & & & & & 1 & 1 \\ h_{m-1} & & & & & & & & & & & 1 \end{bmatrix}.$$

16. The apparatus of claim 14 wherein the parity-check bits are determined by firstly determining $$p_0 = \left(\sum_{row} H_1\right) s^T,$$

where $$\sum_{row} H_1$$

denotes the row vector after summing up all rows of $H_1$.

17. The apparatus of claim 14 wherein the parity-check bits are determined by firstly determining $$p_0 = \left(\sum_{row} H_1\right) s^T,$$

where $$\sum_{row} H_1$$

denotes the row vector after summing up all rows of $H_1$, and then recursively determining $p_1, \ldots, p_{m-1}$ via $p_1 = h_0 p_0 + v_0$, $p_2 = h_1 p_0 + p_1 + v_1$, $p_3 = h_2 p_0 + p_2 + v_2$,

. . .

$p_{m-1} = h_{m-2} p_0 + p_{m-2} + v_{m-2}$ where $v = [v_0, v_1, \ldots, v_{m-1}]^T = H_1 s^T$.

18. An apparatus comprising:
 storage means for storing a matrix H;
 a receiver for receiving a signal vector $y = (y_0 \ldots y_{n-1})$; and
 a microprocessor using a matrix H to determine a current symbol set $(s_0, \ldots, s_{k-1})$, wherein H comprises a non-deterministic section $H_1$ and a deterministic section $H_2$, and wherein $H_2$ comprises a first part comprising a column h having an odd weight greater than 2, and a second part comprising matrix elements for row i, column j equal to
 1 for i=j,
 1 for i=j+1,
 0 elsewhere.

19. The apparatus of claim 18 wherein $$H_2 = [\, h \quad H_2' \,] = \begin{bmatrix} h_0 & 1 & & & & & & & & \\ h_1 & 1 & 1 & & & & & & & \\ . & & 1 & 1 & & & 0 & & & \\ . & & & 1 & 1 & & & & & \\ . & & & & 1 & 1 & & & & \\ . & & & & & 1 & 1 & & & \\ . & & 0 & & & & 1 & 1 & & \\ . & & & & & & & 1 & 1 & \\ . & & & & & & & & \ddots & \ddots \\ . & & & & & & & & & 1 & 1 \\ . & & & & & & & & & & 1 & 1 \\ h_{m-1} & & & & & & & & & & & 1 \end{bmatrix}.$$

\* \* \* \* \*